United States Patent
Uraoka et al.

(10) Patent No.: US 10,475,934 B2
(45) Date of Patent: Nov. 12, 2019

(54) THIN FILM TRANSISTOR, METHOD FOR MANUFACTURING SAME AND SEMICONDUCTOR DEVICE COMPRISING SAID THIN FILM TRANSISTOR

(71) Applicants: NATIONAL UNIVERSITY CORPORATION NARA INSTITUTE OF SCIENCE AND TECHNOLOGY, Nara (JP); NISSIN ELECTRIC CO., LTD., Kyoto (JP)

(72) Inventors: Yukiharu Uraoka, Nara (JP); Haruka Yamazaki, Nara (JP); Mami Fujii, Nara (JP); Eiji Takahashi, Kyoto (JP)

(73) Assignees: NATIONAL UNIVERSITY CORPORATION NARA INSTITUTE OF SCIENCE AND TECHNOLOGY, Nara (JP); NISSIN ELECTRIC CO., LTD., Kyoto (JP)

( * ) Notice: Subject to any disclaimer, the term of this patent is extended or adjusted under 35 U.S.C. 154(b) by 0 days.

(21) Appl. No.: 16/060,415

(22) PCT Filed: Dec. 7, 2016

(86) PCT No.: PCT/JP2016/086399
§ 371 (c)(1),
(2) Date: Jun. 7, 2018

(87) PCT Pub. No.: WO2017/099129
PCT Pub. Date: Jun. 15, 2017

(65) Prior Publication Data
US 2019/0006525 A1 Jan. 3, 2019

(30) Foreign Application Priority Data

Dec. 8, 2015 (JP) ................................ 2015-239755

(51) Int. Cl.
*H01L 29/786* (2006.01)
*H01L 21/02* (2006.01)
(Continued)

(52) U.S. Cl.
CPC .... *H01L 29/78693* (2013.01); *H01L 21/0217* (2013.01); *H01L 21/02274* (2013.01);
(Continued)

(58) Field of Classification Search
CPC ......... H01L 29/78693; H01L 29/66742; H01L 29/42384; H01L 29/41733; H01L 29/1033;
(Continued)

(56) References Cited

U.S. PATENT DOCUMENTS 5,571,734 A * 11/1996 Tseng ................ H01L 21/28176
257/E21.194
2010/0289020 A1* 11/2010 Yano ................ H01L 29/78603
257/43
(Continued)

FOREIGN PATENT DOCUMENTS

| JP | 2010165922 | 7/2010 |
|----|------------|--------|
| JP | 2011129889 | 6/2011 |

(Continued)

OTHER PUBLICATIONS

"International Search Report (Form PCT/ISA/210)" of PCT/JP2016/086399, dated Jan. 10, 2017, with English translation thereof, pp. 1-4.
(Continued)

*Primary Examiner* — Dao H Nguyen
(74) *Attorney, Agent, or Firm* — JCIPRNET

(57) ABSTRACT

A thin film transistor having a high operation speed with a field effect mobility greater than 20 cm$^2$/Vs and a method for manufacturing the same, and a semiconductor device having
(Continued)

the same are provided. A thin film transistor in which a gate electrode, a gate insulating film and an oxide semiconductor film are laminated on a substrate, a source region and a drain region are respectively formed in outer portions of the oxide semiconductor film in the width direction, and a channel region is formed in a region between the source region and the drain region; and a source electrode is connected to the source region, while a drain electrode is connected to the drain region. The gate insulating film contains fluorine; and the ratio of the width W of the channel region to the length L thereof, namely W/L is less than 8.

11 Claims, 3 Drawing Sheets

(51) Int. Cl.
*H01L 21/324* (2006.01)
*H01L 29/08* (2006.01)
*H01L 29/10* (2006.01)
*H01L 29/417* (2006.01)
*H01L 29/423* (2006.01)
*H01L 29/66* (2006.01)

(52) U.S. Cl.
CPC ........ *H01L 21/324* (2013.01); *H01L 29/0847* (2013.01); *H01L 29/1033* (2013.01); *H01L 29/41733* (2013.01); *H01L 29/42384* (2013.01); *H01L 29/66742* (2013.01)

(58) Field of Classification Search
CPC ........... H01L 29/0847; H01L 29/78696; H01L 29/7869; H01L 29/78618; H01L 29/78606; H01L 29/66969; H01L 29/4908; H01L 21/324; H01L 21/02274; H01L 21/0217; H01L 21/0221

USPC ................ 257/43, 40, 57, 60, 347, E29.151, 257/E29.162, E29.279, E29.291, E21.143, 257/E21.194, E21.412, E21.413, E21.414; 438/104, 151, 164, 303, 591, 694; 524/516

See application file for complete search history.

(56) References Cited

U.S. PATENT DOCUMENTS

| | | | |
|---|---|---|---|
| 2011/0133181 A1* | 6/2011 | Yamazaki | H01L 27/1225 257/43 |
| 2011/0193071 A1* | 8/2011 | Yahagi | C08F 12/20 257/40 |
| 2011/0281394 A1* | 11/2011 | Yamazaki | H01L 21/0237 438/104 |

FOREIGN PATENT DOCUMENTS

| | | |
|---|---|---|
| JP | 2013149788 | 8/2013 |
| JP | 2014029032 | 2/2014 |
| JP | 2015018889 | 1/2015 |
| JP | 5790893 | 10/2015 |
| TW | 201503265 | 1/2015 |
| WO | 2012077163 | 6/2012 |

OTHER PUBLICATIONS

Office Action of Korean Counterpart Application, with English translation thereof, dated Jun. 28, 2019, pp. 1-10.
"Office Action of Taiwan Counterpart Application", dated Jul. 18, 2017, with English translation thereof, p. 1-p. 13.
"Office Action of Japan Counterpart Application", dated May 9, 2016, with English translation thereof, p. 1-p. 7.

* cited by examiner

THIN FILM TRANSISTOR, METHOD FOR MANUFACTURING SAME AND SEMICONDUCTOR DEVICE COMPRISING SAID THIN FILM TRANSISTOR

CROSS-REFERENCE TO RELATED APPLICATION

This application is a 371 application of the international PCT application serial no. PCT/JP2016/086399, filed on Dec. 7, 2016, which claims the priority benefit of Japan application no. 2015-239755, filed on Dec. 8, 2015. The entirety of each of the abovementioned patent applications is hereby incorporated by reference herein and made a part of this specification.

TECHNICAL FIELD

The present invention relates to a thin film transistor using an oxide semiconductor in a channel region and a method for manufacturing the same and a semiconductor device including the thin film transistor.

BACKGROUND ART

In recent years, for display devices such as a liquid crystal display device, a light emitting display device, and an electrophoretic display device, while there is a strong demand for high pixel density, there is also a strong demand for reduction in power consumption. Under such circumstances, an active matrix type display device has been proposed in place of a simple matrix type display device of the related art.

That is, in the active matrix type display device, since a switching element is provided for each display pixel (or one dot), even if pixel density increases, it can be driven at a low voltage, which is preferable.

For a switching element of such an active matrix type display device, for example, a semiconductor device in which a circuit including a thin film transistor (hereinafter referred to as a "TFT") using an oxide semiconductor in a channel region is formed on a substrate having light transmission is used (for example, Patent Literature 1 to 3).

As such an oxide semiconductor of the TFT, for example, a zinc oxide (ZnO) or In—Ga—Zn—O oxide semiconductor represented by a general formula of $InGaO_3(ZnO)_m$ is used. Since the TFT using such oxide semiconductors in a channel region can obtain a higher field effect mobility than a conventional transistor using amorphous silicon, an operation speed is high, and it is preferable as a switching element of an active matrix type display device.

Specifically, in a conventional transistor using amorphous silicon, the field effect mobility remains at generally about 0.5 cm$^2$/Vs. However, in the TFT using an oxide semiconductor, a higher field effect mobility of 10 to 20 cm$^2$/Vs is obtained.

In addition, since it is possible to form an active layer by a sputtering method, an oxide semiconductor can be more easily formed than LTPS (low temperature poly-silicon crystal) or amorphous silicon.

Therefore, a semiconductor device in which a TFT using an oxide semiconductor in a channel region is formed on a substrate is expected to be applied to a wide range of fields of liquid crystal display elements, organic EL display elements, electronic paper, other electronic devices, optical devices, and the like.

CITATION LIST

Patent Literature

[Patent Literature 1]
　WO2012/077163
[Patent Literature 2]
　Japanese Unexamined Patent Application Publication No. 2013-149788
[Patent Literature 3]
　Japanese Unexamined Patent Application Publication No. 2015-018889

SUMMARY OF INVENTION

Technical Problem

However, in recent years, the size of display devices has increased. With the increase in the size of display devices, the field effect mobility of 10 to 20 cm$^2$/Vs described above is not sufficient, and a TFT having a superior field effect mobility is desired.

Specifically, in recent years, for televisions for home use, large display devices including a display screen with a diagonal size of 40 to 50 inches have begun to spread. The spread of such large display devices is expected to further accelerate in the future.

As described above, since a TFT using an oxide semiconductor in a channel region obtains an excellent field effect mobility that is 10 times or more that of a TFT using amorphous silicon, it is preferable as a pixel switching element of a large display device.

In addition, a field effect mobility of greater than 20 cm$^2$/Vs is required for a switching element that is used for Super Hi-Vision or higher formats that have been studied recently for next-generation display devices.

Therefore, in recent years, for large display devices, it has been desired to provide a TFT of which a transistor current capability is sufficiently improved by a field effect mobility of greater than 20 cm$^2$/Vs which is a limit of a conventional TFT being exhibited.

Here, an objective of the present invention is to provide a thin film transistor having a field effect mobility of greater than 20 cm$^2$/s and a high operation speed and a method for manufacturing the same and a semiconductor device including the thin film transistor.

Solution to Problem

In order to realize a TFT having a high operation speed so that a field effect mobility is greater than 20 cm$^2$/Vs, the inventors conducted various experiments and studies regarding materials of members constituting the TFT.

As a result, it was found that, when conventionally, a TFT is manufactured, an oxide semiconductor film is laminated on a gate insulating film, and a part thereof is formed as a channel region, but in this case, fluorine is contained in the gate insulating film, a field effect mobility in the channel region is greatly improved.

Such improvement in field effect mobility is thought to be caused by the fact that, when fluorine contained in the gate insulating film diffuses and moves toward the oxide semiconductor film, fluorine is bonded to and terminates a dangling bond that is present at an interface between the oxide semiconductor film and the gate insulating film or a part with weak bonds such as Zn—O, In—O, and Ga—O.

That is, although when there is a dangling bond or a part with weak bonds, an interface state density at an interface between an oxide semiconductor and a gate insulating film is not reduced, and oxide semiconductor carriers are scattered which become a factor hindering a carrier mobility, that is, a field effect mobility, from improving, it is thought that, when fluorine is bonded to and terminates this part, the interface state density can be reduced and the field effect mobility is improved.

In addition, as results of additional studies, it was found that, in TFTs in which fluorine is contained in the gate insulating film, a ratio (W/L) of a width (W) to a length (L) of a channel region is greatly related to a field effect mobility, and when the W/L decreases, the field effect mobility sharply increases.

That is, it is known that, even in the conventional TFT, when the W/L decreases, the field effect mobility increases. However, it has been found that, when fluorine is contained in the gate insulating film, a degree of the increase in the field effect mobility is significantly higher than in the related art.

Based on such findings, the inventors additionally conducted experiments and studies and found that, when a gate insulating film containing fluorine is used and the W/L is set to be less than 8, a high field effect mobility of greater than 20 cm$^2$/Vs which has not been obtained in a conventional TFT is exhibited.

In addition, in the above experiment, it was found that, when the W/L of the channel region is 0.8 or less, the field effect mobility increases further sharply, and a field effect mobility of greater than 50 cm$^2$/Vs which has not been predicted in a conventional TFT is obtained.

A first aspect and a second aspects of the present disclosure are based on the above findings.

The first aspect of the present disclosure is a thin film transistor in which a gate electrode, a gate insulating film, and an oxide semiconductor film are laminated on a substrate, a source region and a drain region are formed on both outer sides of the oxide semiconductor film in a width direction, a channel region is formed in a region between the source region and the drain region, a source electrode is connected to the source region, and a drain electrode is connected to the drain region, wherein fluorine is contained in the gate insulating film, and a ratio (W/L) of a width W to a length L of the channel region is less than 8.

In addition, the second aspect of the present disclosure is the thin film transistor according to the first aspect of the present disclosure, wherein a ratio (W/L) of a width W to a length L of the channel region is 0.8 or less.

Next, the inventors have studied a preferable content of fluorine in the above gate insulating film. As a result, it was found that, when a content of fluorine is 1 at % or more, a sufficient amount of fluorine can diffuse and move into the oxide semiconductor film, which is preferable. On the other hand, it was found that, when a content of fluorine is greater than 25 at %, there are risks of deterioration of film characteristics such as a decrease in density of the gate insulating film and deterioration of insulation properties.

A third aspect of the present disclosure is based on the above findings and is the thin film transistor according to the first or the second aspect of the present disclosure, wherein a content of fluorine in the gate insulating film is 1 to 25 at %.

In addition, it was found that a fluorinated silicon nitride is preferable as a gate insulating film containing fluorine in this manner.

That is, a fourth aspect of the present disclosure is the thin film transistor according to any one of the first to the third aspects of the present disclosure, wherein the gate insulating film is made of a fluorinated silicon nitride.

In addition, when hydrogen is contained in the gate insulating film, hydrogen diffuses and moves toward the oxide semiconductor film, and hydrogen serves as a carrier and a current flows. Accordingly, there is a risk of electrical characteristics of the TFT after manufacture being changed and reliability being reduced. According to experimental results, it was found that a preferable hydrogen content in the gate insulating film is 1 at % or less.

That is, a fifth aspect of the present disclosure is the thin film transistor according to any one of the first to the fourth aspects of the present disclosure, wherein a hydrogen content of the gate insulating film is 1 at % or less.

In addition, in order to improve the current capability of the TFT, the oxide semiconductor film is preferably made of any of In—Ga—Zn—O type, In—Sn—Zn—O type, and In—W—Zn—O type oxide semiconductors, and is more preferably made of an amorphous oxide.

That is, a sixth aspect of the present disclosure is the thin film transistor according to any one of the first to the fifth aspects of the present disclosure, wherein the oxide semiconductor film is made of any of In—Ga—Zn—O type, In—Sn—Zn—O type, and In—W—Zn—O type amorphous oxides.

The inventors then studied a specific method for manufacturing the above TFT, and as result, found the following.

As described above, in the TFT of the present invention, a gate insulating film containing fluorine is formed, fluorine diffuses and moves toward an oxide semiconductor film from the gate insulating film, and the W/L of the channel region is less than 8. Therefore, the field effect mobility of the TFT is improved more than in the related art.

In addition, it was found that, when fluorine diffuses and moves toward the oxide semiconductor film from the gate insulating film, bonds such as Zn—F and In—F are thought to occur, but such bonds have a high binding energy and the bonds do not break due to electric field stress or the like, and thus can contribute to manufacturing a TFT with high reliability.

A seventh aspect of the present disclosure is based on the above findings, and is a method for manufacturing a thin film transistor in which a gate electrode, a gate insulating film, and an oxide semiconductor film are laminated on a substrate, a source region and a drain region are formed on both outer sides of the oxide semiconductor film in a width direction, a channel region is formed in a region between the source region and the drain region, a source electrode is connected to the source region, and a drain electrode is connected to the drain region, the method including:

forming a gate insulating film containing fluorine as the gate insulating film; and forming the source region and the drain region on the oxide semiconductor film so that a ratio (W/L) of a width W to a length L of the channel region is less than 8.

Next, the inventors studied an appropriate method for forming a gate insulating film containing fluorine in this manner and as a result, found that a gas in which silicon tetrafluoride (SiF$_4$) and nitrogen (N$_2$) are mixed is preferably used as a raw material gas when a gate insulating film is formed using a plasma CVD method.

That is, conventionally, when a gate insulating film is formed using a plasma CVD method, a gas in which silane (SiH$_4$), ammonia (NH$_4$), and nitrogen (N$_2$) are mixed is used as a raw material gas. However, since silane (SiH$_4$) contains hydrogen, hydrogen (H) is mixed into the formed gate insulating film, and hydrogen in the gate insulating film diffuses and moves into the oxide semiconductor film. In this case, hydrogen that diffuses and moves serves as a carrier, and a current flows. Accordingly, there is a risk of electrical characteristics of the TFT after manufacture being changed and reliability being reduced.

On the other hand, since a gas in which silicon tetrafluoride ($SiF_4$) and nitrogen ($N_2$) are mixed contains no hydrogen, hydrogen (H) does not enter the formed gate insulating film and a hydrogen content of the gate insulating film can be 1 at % or less. As a result, it is possible to provide a TFT with high reliability without changes in electrical characteristics of the TFT after manufacture.

However, the above gas in which silicon tetrafluoride and nitrogen are mixed has a characteristic that it is less likely to be discharged and decomposed than a conventional raw material gas, that is, a gas in which silane ($SiH_4$), ammonia ($NH_4$), and nitrogen ($N_2$) are mixed. Therefore, as a result of studying a plasma CVD method through which such a gas in which silicon tetrafluoride and nitrogen are mixed can be discharged and decomposed with high efficiency, it was found that a inductively coupled plasma CVD method is preferable.

That is, according to the inductively coupled plasma CVD method, since it is possible to generate a large induced electric field in a plasma, it is possible to discharge and decompose silicon tetrafluoride and nitrogen with high efficiency. As a result, it is possible to form a gate insulating film made of a fluorinated silicon nitride as the gate insulating film containing fluorine with high efficiency.

A eighth and a ninth aspects of the present disclosure are based on the above findings. The eighth aspect of the present disclosure is the method of manufacturing the thin film transistor according to the seventh aspect of the present disclosure, wherein, as the gate insulating film, a gate insulating film made of a fluorinated silicon nitride is formed according to a plasma CVD method using a gas in which silicon tetrafluoride and nitrogen are mixed as a raw material gas.

The ninth aspect of the present disclosure is the method for manufacturing a thin film transistor according to the eighth aspect of the present disclosure, wherein an inductively coupled plasma CVD method is used as the plasma CVD method.

The inventors further studied the above method of manufacturing a TFT, and as a result, found that, after an oxide semiconductor film is laminated on a gate insulating film, when an annealing treatment is performed in an atmosphere containing nitrogen and oxygen, fluorine is likely to diffuse and move toward the oxide semiconductor film from the gate insulating film. Therefore, when the gate insulating film containing fluorine is formed, the annealing treatment is preferably performed after the source region and the drain region are formed in the oxide semiconductor film.

That is, a tenth aspect of the present disclosure is the method for manufacturing a thin film transistor according to any one of the seventh to ninth aspects of the present disclosure, wherein, after the source region and the drain region are formed on the oxide semiconductor film, an annealing treatment is performed in an atmosphere containing nitrogen and oxygen.

The above annealing treatment is preferably performed at a treatment temperature of 150 to 450° C. and for 0.5 to 2 hours in order to diffuse and move fluorine contained in the gate insulating film to the oxide semiconductor film reliably and sufficiently.

An eleventh aspect of the present disclosure is the method for manufacturing a thin film transistor according to the tenth aspect of the present disclosure, wherein the annealing treatment is performed at 150 to 450° C. for 0.5 to 2 hours.

In addition, since a semiconductor device including a circuit constituted by the above thin film transistor can exhibit an excellent field effect mobility and provide a high resolution, it can be preferably applied as a switching element of a display device with a large screen, and particularly, it can be preferably used for a large display device of 40 inches or more.

That is, a twelfth aspect of the present disclosure is a semiconductor device including a circuit constituted by the thin film transistor according to any one of the first to the sixth aspects of the present disclosure.

Advantageous Effects of Invention

According to the present invention, it is possible to provide a thin film transistor having a field effect mobility of greater than 20 $cm^2/Vs$ and a method for manufacturing the same and a semiconductor device including the thin film transistor.

DESCRIPTION OF EMBODIMENTS

Embodiments of the present invention will be described below with reference to the drawings.

Figure 1A:
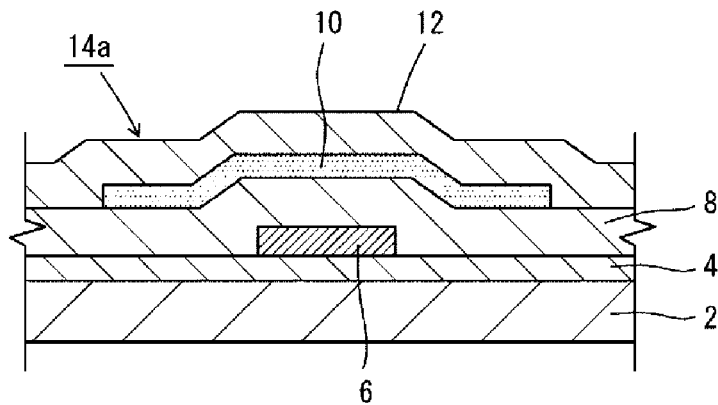
FIGS. 1 (A) to 1(C) are cross-sectional views showing an outline of a method of manufacturing a TFT according to an embodiment of the present invention.
Figure 1B:
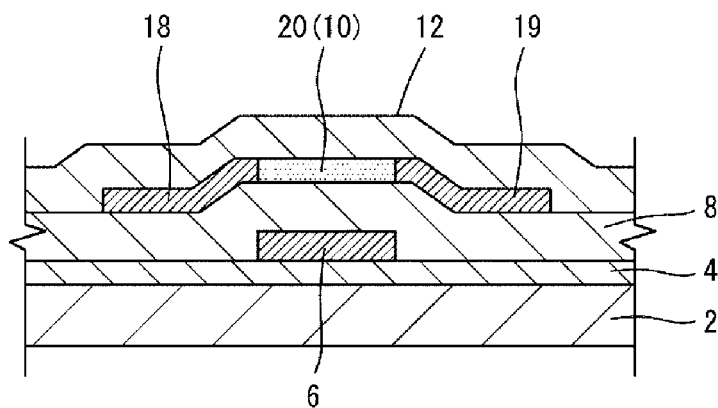
Figure 1C:
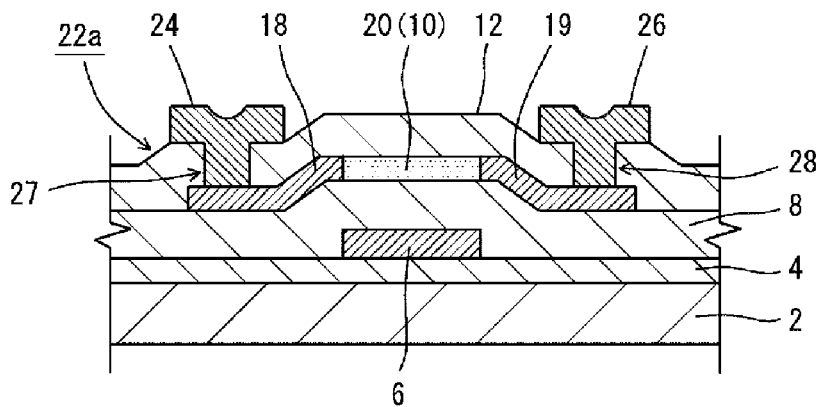

1. Configuration of TFT According to the Present Embodiment (1) Schematic Configuration FIGS. 1 (A) to 1(C) are cross-sectional views showing an outline of a method of manufacturing a TFT according to the present embodiment. FIG. 1(A) shows a structure which is a precursor of a TFT, FIG. 1(B) shows a structure in which a source region and a drain region are formed on an oxide semiconductor film, and FIG. 1(C) shows a TFT after manufacturing. In addition, FIG. 2 is a view of a gate electrode and an oxide semiconductor film of a TFT according to the present embodiment when viewed from the side of a substrate.

The TFT of the present embodiment is an inversely-staggered TFT, and as shown in FIG. 1(C), on a surface of a substrate 2, as necessary, a diffusion prevention film 4 for preventing diffusion of impurities contained in the substrate 2 is provided in advance.

Then, a gate electrode 6 is formed on the diffusion prevention film 4, and a gate insulating film 8 is formed to cover the gate electrode 6. In addition, an oxide semiconductor film 10 is formed on an upper surface of the gate insulating film 8.

Figure 2:
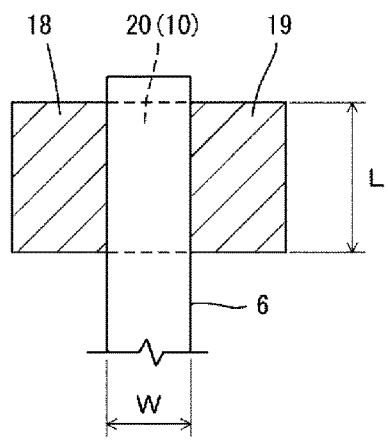
FIG. 2 is a view of a gate electrode and an oxide semiconductor film of the TFT according to the embodiment of the present invention when viewed from the side of a substrate.

As shown in FIG. 1(C) and FIG. 2, a source region 18 and a drain region 19 are formed on both outer sides of the oxide semiconductor film 10 in a width direction, and a channel region 20 is formed in a region interposed between the source region 18 and the drain region 19.

Then, a protective film 12 is formed on an upper surface of the oxide semiconductor film 10, and contact holes 27 and 28 that penetrate to positions in contact with the source region 18 and the drain region 19 are formed in the protective film 12. Then, a source electrode 24 is connected to the source region 18 through the contact hole 27 and a drain electrode 26 is connected to the drain region 19 through the contact hole 28.

(2) Characteristics of TFT According to the Present Embodiment (a) Gate Insulating Film According to a first aspect of the TFT of the present embodiment, fluorine is contained in the gate insulating film 8 that is formed between the gate electrode 6 and the oxide semiconductor film 10.

In a conventional TFT, since there is a dangling bond or a part with weak bonds such as Zn—O, In—O, and Ga—O at an interface between the oxide semiconductor film 10 and the gate insulating film 8, an interface state density increases, carriers are scattered, and a reduction in field effect mobility is caused.

On the other hand, in the present embodiment, since fluorine is contained in the gate insulating film 8, when fluorine in the gate insulating film 8 diffuses and moves toward the oxide semiconductor film 10, fluorine is bonded to and terminates a dangling bond or a part with weak bonds that is present at an interface between the oxide semiconductor film 10 and the gate insulating film 8.

In this manner, when fluorine is bonded to Zn—O, In—O, Ga—O, or the like and Zn—F, In—F, or Ga—F is formed, since a binding energy becomes higher and stable as follows, the interface state density of the oxide semiconductor film 10 (the channel region 20) is lowered and the field effect mobility can be improved more than in the related art.

(Energy for Binding with Oxygen)
Zn—O=284 kJ/mol
In—O=346 kJ/mol
Ga—O=374 kJ/mol (Energy for Binding with Fluorine)
Zn—F=364 kJ/mol
In—F=530 kJ/mol
Ga—F=627 kJ/mol (b) Ratio (W/L) of Width W to Length L of Channel Region In addition, according to a second aspect of the TFT of the present embodiment, a ratio (W/L) of a width W to a length L of the channel region 20 shown in FIG. 2 is set to less than 8.

Figure 4:
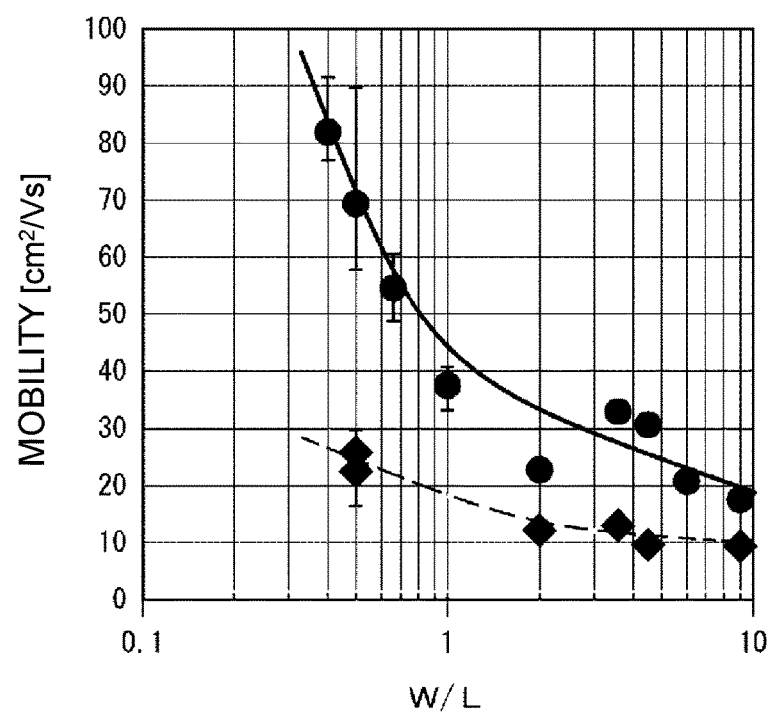
FIG. 4 is a graph showing a relationship between a field effect mobility and a ratio (W/L) of a width W to a length L of a channel region.

As will be described in detail below, FIG. 4 is a graph showing results of experiments conducted by the inventors to reach the present invention, and shows a relationship between a field effect mobility and a ratio (W/L) of a width W to a length L of a channel region. In the graph in FIG. 4, the horizontal axis represents a ratio (W/L) of a width W to a length L of the channel region 20 and the vertical axis represents a field effect mobility (mobility). Here, in FIG. 4, ● indicates a TFT in which fluorine is contained in the gate insulating film 8 and ♦ indicates a conventional TFT in which a gate insulating film from a thermal oxide film is formed.

It can be understood from FIG. 4 that TFTs in which fluorine is contained in the gate insulating film 8 can exhibit an excellent field effect mobility compared with a conventional TFT, and when the W/L of the channel region 20 is less than 8, a high field effect mobility of greater than 20 cm$^2$/Vs, which has been difficult to obtain in a conventional TFT, is obtained.

In addition, it can be understood that, when the W/L of the channel region 20 is less than 1, the field effect mobility increases sharply as the W/L further decreases, and when the W/L of the channel region 20 is 0.8 or less, a very high field effect mobility of 50 cm$^2$/Vs, which has not been expected in a conventional TFT, is exhibited.

As described above, in the TFT according to the present embodiment, fluorine is contained in the gate insulating film 8 that is formed between the gate electrode 6 and the oxide semiconductor film 10, and since the ratio (W/L) of a width W to a length L of the channel region 20 is set to less than 8, the field effect mobility is greatly improved compared to the related art.

Thus, when a large size display device of 20 inches or more is produced, even if a driver is not separately provided, since suitable performance can be maintained, a semiconductor device including a circuit constituted by such a TFT having an excellent field effect mobility can be preferably applied to a large display device.

2. Manufacturing Method (1) Production of Structure

Next, a method of manufacturing the TFT according to the present embodiment will be described. First, a structure 14a as shown in FIG. 1(A) which is a precursor of the TFT is produced according to the following procedures.

(a) Preparation of Substrate

First, the substrate 2 made of a material that can transmit light is prepared. Examples of the substrate 2 include polyethylene terephthalate (PET), polyethylene naphthalate (PEN), polyethersulfone (PES), a plastic such as an acrylic and a polyimide (synthetic resin), and glass.

(b) Formation of Diffusion Prevention Film

Next, the diffusion prevention film 4 is formed on an upper surface of the substrate 2. A method such as a plasma CVD method or a sputtering method is used to form the diffusion prevention film 4. As a constituent material of the diffusion prevention film 4, for example, a fluorinated silicon nitride film in which fluorine is contained in a silicon nitride film, may be exemplified. Here, as described above, the diffusion prevention film may not be provided, and in that case, the process directly advances to the following formation of a gate electrode.

(c) Formation of Gate Electrode

Next, the gate electrode 6 is formed on an upper surface of the diffusion prevention film 4. The gate electrode 6 is formed to have a film thickness of 100 to 200 nm using, for example, a sputtering method. Here, as a material of the gate electrode 6, for example, an element selected from among aluminum (Al), copper (Cu), tantalum (Ta), tungsten (W), titanium (Ti), molybdenum (Mo), chromium (Cr), and niobium (Nb), an alloy material containing such elements as a main component, or a compound material, may be exemplified.

(d) Formation of Gate Insulating Film

Next, the gate insulating film 8 is formed to cover the diffusion prevention film 4 and the gate electrode 6. As described above, the present embodiment is different from the related art in that a gate insulating film containing fluorine is formed as a gate insulating film. Here, the film thickness is preferably 50 to 300 nm.

The gate insulating film 8 containing fluorine is formed by, for example, a plasma CVD method using a gas in which silicon tetrafluoride ($SiF_4$) gas and nitrogen ($N_2$) gas are mixed as a raw material gas. Therefore, it is possible to form the gate insulating film 8 containing fluorinated silicon nitride (SiN:F) as a main component. Here, a content of fluorine in the gate insulating film is preferably 1 to 25 at %.

In addition, when a gas in which silicon tetrafluoride gas and nitrogen gas are mixed is used as a raw material gas, since hydrogen (H) is prevented from entering the gate insulating film 8, and the gate insulating film 8 having a hydrogen content of 1 at % or less can be formed, it is possible to manufacture a TFT with high reliability. Here, when a gas in which silicon tetrafluoride gas and nitrogen gas are mixed is used, in order to discharge and decompose such a gas with high efficiency, generate a high density plasma, and form a silicon oxynitride film with high efficiency, a inductively coupled plasma CVD method is preferably used as a method of forming the gate insulating film 8. Thus, in this case, a temperature of the substrate 2 is preferably 100 to 300° C. in order to prevent an adverse effect due to heat applied to the substrate 2 and the gate insulating film 8 and form a silicon oxynitride film having favorable characteristics.

A plasma CVD device that is used in the inductively coupled plasma CVD method will be described with reference to FIG. 3.

In the present embodiment, the plasma CVD device is an inductively coupled plasma CVD device configured to generate a plasma 50 by an induced electric field that is generated by applying a high frequency current to a planar conductor 44 from a high frequency power supply 52 and form a film on a substrate 30 using the plasma 50 by the plasma CVD method.

Figure 3:
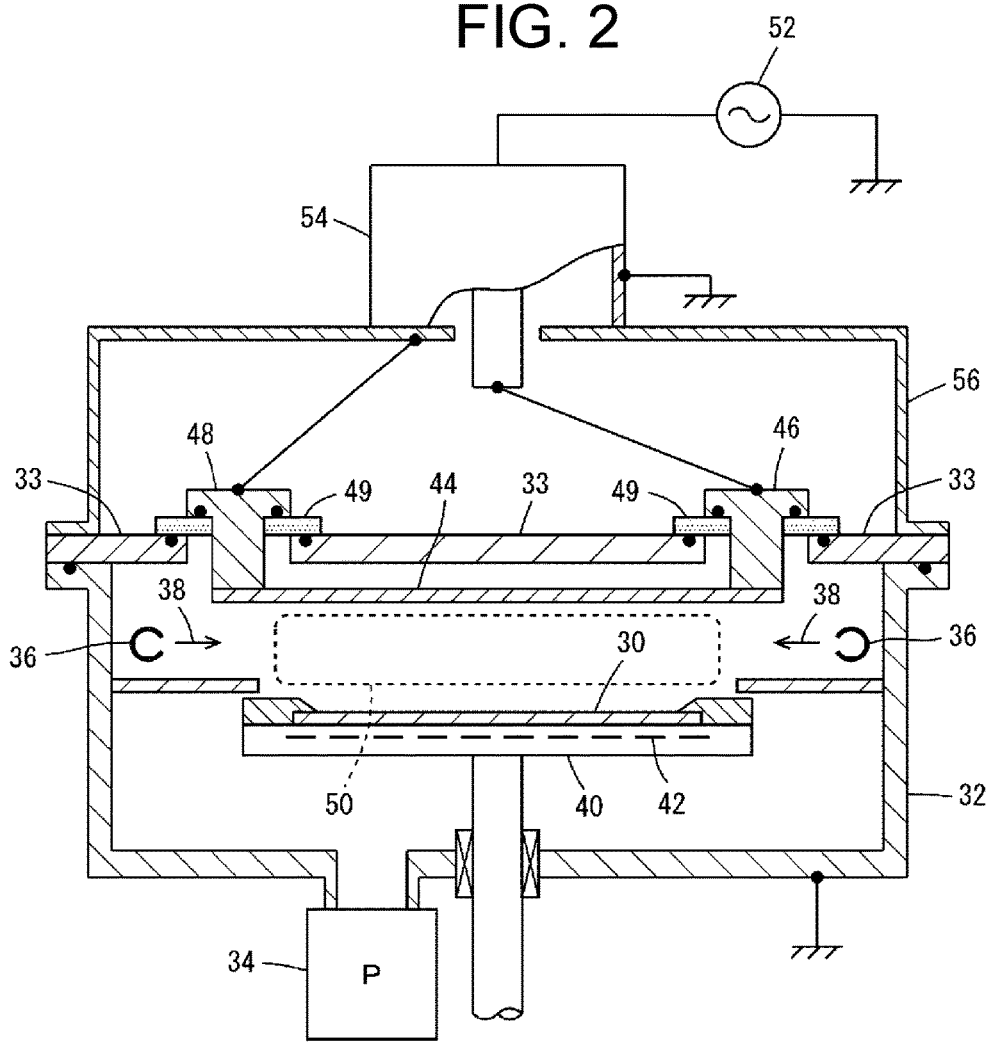
FIG. 3 is a diagram explaining a plasma CVD device that is used in the embodiment of the present invention.

Here, as the substrate 30 in FIG. 3, a substrate constituting the above structure or a substrate on which a required film or electrode is formed is used.

Further, the plasma CVD device includes, for example, a vacuum chamber 32 made of a metal, and the inside thereof is evacuated by a vacuum exhaust system 34.

A raw material gas 38 is introduced into the vacuum chamber 32 through a gas inlet pipe 36 according to details of a treatment applied to the substrate 30. As the raw material gas 38, as described above, a gas in which silicon tetrafluoride ($SiF_4$) gas and nitrogen ($N_2$) gas are mixed is used, and this is introduced together with an oxygen-containing gas such as oxygen ($O_2$) gas and nitrogen monoxide ($N_2O$)) gas.

A holder 40 for holding the substrate 30 is provided in the vacuum chamber 32. In addition, a heater 42 configured to heat the substrate 30 is provided in the holder 40.

In the vacuum chamber 32, more specifically, inside a ceiling surface 33 of the vacuum chamber 32, the planar conductor 44 having a rectangular planar shape is provided so that it faces a substrate holding surface of the holder 40. The planar shape of the planar conductor 44 may be a rectangle or a square. A specific form of the planar shape may be determined according to, for example, the planar shape of the substrate 30.

From the high frequency power supply 52 through a matching circuit 54, and through a power supply electrode 46 and a terminating electrode 48, high frequency power is supplied between a power supply end on one end side and a termination end on the other end side of the planar conductor 44 in a longitudinal direction, and accordingly a high frequency current flows in the planar conductor 44. A frequency of high frequency power output from the high frequency power supply 52 is generally, for example, 13.56 MHz, but the present invention is not limited thereto.

The power supply electrode 46 and the terminating electrode 48 are attached to the ceiling surface 33 of the vacuum chamber 32 through an insulation flange 49. A packing for vacuum sealing is provided between these elements. As in this example, a part above the ceiling surface 33 is preferably covered with a shield box 56 for preventing high frequency power supply leakage.

When a high frequency current is applied to the planar conductor 44 as described above, a high frequency magnetic field is generated around the planar conductor 44, and accordingly an induced electric field is generated in a direction opposite to that of the high frequency current. Due to the induced electric field, in the vacuum chamber 32, electrons accelerate and the raw material gas 38 in the vicinity of the planar conductor 44 is ionized, and the plasma 50 is generated in the vicinity of the planar conductor 44. The plasma 50 diffuses to the vicinity of the substrate 30 and a film can be formed on the substrate 30 using the plasma 50 according to a plasma CVD method.

According to this film formation method, as described above, since a gas containing no hydrogen is used as the raw material gas 38, a film including a fluorinated silicon nitride (SiN:F) containing no hydrogen as a main component can be formed on the substrate 30. In addition, silicon tetrafluoride ($SiF_4$) gas and nitrogen ($N_2$) gas are less likely to be discharged and decomposed than silane ($SiH_4$) and ammonia ($NH_3$) that are often used in the related art. However, according to an inductively coupled plasma CVD method, since a large induced electric field can be generated in the plasma 50, silicon tetrafluoride ($SiF_4$) gas and nitrogen ($N_2$) gas can be discharged and decomposed with high efficiency. As a result, it is possible to generate the plasma 50 with high density and form a silicon oxynitride film on the substrate 30 with high efficiency.

In addition, when the temperature of the substrate 30 is set to be within this range, it is possible to form a silicon oxynitride film having favorable characteristics while preventing an adverse effect due to heat applied to the substrate 30 and the film.

(e) Formation of Oxide Semiconductor Film

Next, the oxide semiconductor film 10 with a thickness of 25 to 200 nm, and preferably a thickness of 30 to 150 nm is formed on the gate insulating film 8 using a sputtering method (for example, an RF sputtering method). Here, as the oxide semiconductor film 10 to be formed, for example, an In—Ga—Zn—O amorphous oxide semiconductor (a-IGZO) film, may be exemplified, but In—Sn—Zn—O and In—W—Zn—O amorphous oxide semiconductors may be used.

As a specific method of forming the oxide semiconductor film 10, first, a film having a predetermined thickness is formed using a sputtering method, and etching is performed by photolithography to form a desired shape. Here, in etching in this case, for example, diluted hydrofluoric acid is used.

(f) Formation of protective film

Next, the protective film 12 is formed using a plasma CVD method to cover an upper surface of the formed oxide semiconductor film 10. As the protective film 12, a film having electrical insulating properties such as a silicon oxide ($SiO_2$) film is used. Here, the silicon oxide film can be formed by, for example, a solution method using a photosensitive siloxane.

(2) Formation of Channel Region

Next, the channel region 20 shown in FIG. 1(B) is formed in a region interposed between the source region 18 and the drain region 19 of the oxide semiconductor film 10 of the structure 14a obtained as described above.

In the present embodiment, formation regions of the oxide semiconductor film 10 and the gate electrode 6 are adjusted in advance so that the W/L of the channel region 20 formed in this case is less than 8.

(3) Annealing Treatment

Next, an annealing treatment (post annealing) is performed in an atmosphere containing nitrogen and oxygen. A treatment temperature is 150 to 450° C., and preferably 250 to 350° C. A treatment time is 0.5 to 2 hours and preferably 1 to 1.5 hours.

In the present embodiment, according to the annealing treatment, fluorine contained in the gate insulating film 8 is likely to diffuse and move toward the oxide semiconductor film 10. Then, the diffused and moved fluorine bonds to and terminates a dangling bond that is present at an interface between the oxide semiconductor film 10 and the gate insulating film 8 or a part with weak bonds. Accordingly, it is possible to improve a field effect mobility of the oxide semiconductor film 10 (the channel region 20) more than in the related art.

(4) Formation of Electrode

Next, electrodes are connected to the source region 18 and the drain region 19 after formation in the same manner as in the related art. Specifically, as shown in FIG. 1(C), the contact holes 27 and 28 that penetrate the protective film 12 are formed, and the source electrode 24 and the drain electrode 26 are inserted into the contact holes 27 and 28. Therefore, the source electrode 24 is connected to the source region 18, and the drain electrode 26 is connected to the drain region 19. As described above, a TFT 22a is manufactured.

Examples

The present invention will be described below in detail with reference to examples.

1. Test Examples (1) TFT Including Gate Insulating Film Containing Fluorine

A plurality of TFTs including a gate insulating film containing fluorine with different ratios (W/L) of a width (W) to a length (L) of a channel region were produced. Here, the gate insulating film was formed according to an inductively coupled plasma CVD method set under the following conditions.

Composition of gases used: $SiF_4$, $N_2$
Flow rate ratio: $SiF_4/N_2=1/10$
Formation pressure: 4 Pa
High frequency power density: 12 kW Here, contents of fluorine in the gate insulating films obtained in the above were all 1 to 25 at %. An example is shown in Table 1.

TABLE 1

| Elements contained | Content (at %) |
|---|---|
| F | 15.58 |
| O | 10.35 |
| N | 36.35 |
| Si | 37.73 |

(2) TFT Including Gate Insulating Film of the Related Art

A plurality of TFTs including a thermal oxide film of the related art, that is, a gate insulating film made of silicon oxide ($SiO_2$) and containing no fluorine, were produced. Similarly to above, ratios (W/L) of a width (W) to a length (L) of a channel region were different from each other in the TFTs. Here, as the gate insulating film (thermal oxide film), a film containing no hydrogen was used.

2. Measurement of Field Effect Mobility

The field effect mobility of the TFTs obtained above was measured by a semiconductor parameter analyzer.

The results are shown in FIG. 4. In FIG. 4, the vertical axis represents the field effect mobility, and the horizontal axis represents a ratio (W/L) of a width (W) to a length (L) of a channel region. According to the above, in the plot in FIG. 4, ● indicates a TFT in which fluorine was contained in the gate insulating film and ♦ indicates a conventional TFT in which a gate insulating film from a thermal oxide film was formed. Here, in FIG. 4, approximate curves obtained from measurement results in the TFTs in which fluorine was contained in the gate insulating film are shown by solid lines and approximate curves obtained from measurement results in the conventional TFT in which a gate insulating film from a thermal oxide film was formed are shown by dashed lines.

It can be understood from FIG. 4 that the TFTs in which a gate insulating film containing fluorine was formed always had a higher field effect mobility than the conventional TFT in which a gate insulating film from a thermal oxide film was formed. Therefore, it was confirmed that the field effect mobility was able to be improved more than in the related art by providing the gate insulating film containing fluorine.

Next, it was found that, in the TFT in which a gate insulating film containing fluorine was formed, the field effect mobility increased as the W/L of the channel region decreased. Further, it was found that, when the W/L of the channel region was less than 8, a field effect mobility of 20 $cm^2/Vs$ or more was obtained.

Thus, it was found that the field effect mobility starts to rise sharply when the W/L of the channel region falls below 1, and a very high field effect mobility of 50 $cm^2/Vs$ or more was obtained when the field effect mobility was 0.8 or less.

While the present invention has been described above with reference to the embodiments, the present invention is not limited to the above embodiments. Various modifications of the above embodiments can be made within the scope the same as or equivalent to the present invention.

The invention claimed is:

1. A thin film transistor in which a gate electrode, a gate insulating film, and an oxide semiconductor film are laminated on a substrate,
   a source region and a drain region are formed on both outer sides of the oxide semiconductor film in a width direction,
   a channel region is formed in a region between the source region and the drain region,
   a source electrode is connected to the source region, and a drain electrode is connected to the drain region,
   wherein fluorine is contained in the gate insulating film, a content of fluorine in the gate insulating film is 1 to 25 at %, a ratio (W/L) of a width W to a length L of the channel region is less than 8, and the thin film transistor has a field effect mobility of greater than 20 $cm^2/Vs$.

2. The thin film transistor according to claim 1, wherein a ratio (W/L) of a width W to a length L of the channel region is 0.8 or less.

3. The thin film transistor according to claim 1,
wherein the gate insulating film is made of a fluorinated silicon nitride.

4. The thin film transistor according to claim 1,
wherein a hydrogen content of the gate insulating film is 1 at % or less.

5. The thin film transistor according to claim 1,
wherein the oxide semiconductor film is made of any of In—Ga—Zn—O type, In—Sn—Zn—O type, and In—W—Zn—O type amorphous oxides.

6. A semiconductor device including a circuit constituted by the thin film transistor according to claim 1.

7. A method for manufacturing a thin film transistor in which a gate electrode, a gate insulating film, and an oxide semiconductor film are laminated on a substrate,
a source region and a drain region are formed on both outer sides of the oxide semiconductor film in a width direction,
a channel region is formed in a region between the source region and the drain region,
a source electrode is connected to the source region, and
a drain electrode is connected to the drain region, the method comprising:
forming a gate insulating film containing fluorine as the gate insulating film, wherein a content of fluorine in the gate insulating film is 1 to 25 at %; and
forming the source region and the drain region on the oxide semiconductor film so that a ratio (W/L) of a width W to a length L of the channel region is less than 8, wherein the thin film transistor has a field effect mobility of greater than 20 $cm^2/Vs$.

8. The method for manufacturing a thin film transistor according to claim 7,
wherein as the gate insulating film, a gate insulating film made of a fluorinated silicon nitride is formed according to a plasma CVD method using a gas in which silicon tetrafluoride and nitrogen are mixed as a raw material gas.

9. The method for manufacturing a thin film transistor according to claim 8,
wherein an inductively coupled plasma CVD method is used as the plasma CVD method.

10. The method for manufacturing a thin film transistor according to claim 7,
wherein an annealing treatment is performed in an atmosphere containing nitrogen and oxygen after the source region and the drain region are formed on the oxide semiconductor film.

11. The method for manufacturing a thin film transistor according to claim 10,
wherein the annealing treatment is performed at 150 to 450° C. for 0.5 to 2 hours.

* * * * *